US006724672B2

(12) United States Patent
Nirschl

(10) Patent No.: US 6,724,672 B2
(45) Date of Patent: Apr. 20, 2004

(54) INTEGRATED MEMORY HAVING A PRECHARGE CIRCUIT FOR PRECHARGING A BIT LINE

(75) Inventor: Thomas Nirschl, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/325,349

(22) Filed: Dec. 18, 2002

(65) Prior Publication Data

US 2003/0112680 A1 Jun. 19, 2003

(30) Foreign Application Priority Data

Dec. 18, 2001 (DE) .......................... 101 62 260

(51) Int. Cl.[7] ................................. G11C 7/00
(52) U.S. Cl. ...................... 365/203; 365/189.09
(58) Field of Search ..................... 365/189.09, 203, 365/226

(56) References Cited

U.S. PATENT DOCUMENTS 5,258,958 A * 11/1993 Iwahashi et al. ....... 365/185.21
5,309,399 A    5/1994 Murotani .............. 365/189.09
5,717,640 A * 2/1998 Hashimoto ........... 365/189.07
6,191,979 B1 * 2/2001 Uekubo ................. 365/185.25

FOREIGN PATENT DOCUMENTS

DE       33 13 335 A1   11/1983   ........ G11C/7/00

OTHER PUBLICATIONS

Nirschl, T. et al.: "High Speed, Low Power Design Rules for SRAM Precharge and Self–timing under Technology Variations", Power and Timing Modeling, Optimization and Simulation 2001, 10 pp.

* cited by examiner

Primary Examiner—Son Mai
(74) Attorney, Agent, or Firm—Laurence A. Greenberg; Werner H. Stemer; Ralph E. Locher

(57) ABSTRACT

An integrated memory having a memory cell array: including word lines for selecting memory cells, bit lines for reading out or writing data signals of the memory cells, a precharge circuit for precharging at least one of the bit lines to a precharge voltage that differs from a supply voltage of the memory. The precharge circuit has a loop regulating circuit for setting the precharge voltage using an actual voltage of the one of the bit lines. The precharge circuit makes it possible to reduce the power loss of the memory in conjunction with low area consumption.

6 Claims, 2 Drawing Sheets

INTEGRATED MEMORY HAVING A PRECHARGE CIRCUIT FOR PRECHARGING A BIT LINE

BACKGROUND OF THE INVENTION

Field of the Invention

The present invention relates to an integrated memory having a memory cell array, word lines for selecting memory cells, bit lines for reading out or writing data signals of the memory cells, and a precharge circuit for precharging at least one of the bit lines.

An integrated memory generally has a memory cell array including word lines and bit lines. The memory cells are arranged at crossover points between the word lines and the bit lines. The memory cells are connected to one of the bit lines for reading out or writing in a data signal, in each case via a selection transistor whose control input is connected to one of the word lines. A word line selects selection transistors of corresponding memory cells along the word line and opens the selection transistors. If the respective selection transistor is open, then the charge stored in the cell capacitor can pass onto the corresponding bit line, and from there into a read/write amplifier.

In integrated memories, generally after the writing or reading of data signals, the corresponding bit line is precharged to a positive supply voltage of the memory (also referred to as voltage VDD). This precharge voltage is chosen since, on the one hand, it can be made available comparatively simply, and on the other hand, it entails a high so-called static stability for data access. The static stability (so-called static noise margin SNM) is a characteristic quantity for the security during the read-out of data signals and is of great importance for the reliability of the read-out operation. The static stability itself depends on the magnitude of the precharge voltage. A maximum of the static stability is achieved for a precharge voltage VDD at the level of the positive supply voltage of the memory.

The level of the supply voltage of memories is constantly reduced primarily in view of increasing requirements with respect to reliability and low energy consumption. On the other hand, the increase in memory size demands higher processing speeds of memories. By way of example, in the case of large project-specific low-power memories, a large part of the power taken up can be reduced by no longer precharging the bit lines to the positive supply voltage VDD of the memory, but rather only to a precharge voltage that is lower in comparison therewith. A theoretical consideration for precharging a bit line to a voltage less than the positive supply voltage VDD of the memory and an associated reduction of the static stability is discussed in more detail in Th. Nirschl, B. Wicht, D. Schmitt-Landsiedel: High Speed, Low Power Design Rules for SRAM Precharge and Self-timing under Technology Variations; and In: Power and Timing Modeling, Optimization and Simulation 2001, Proceedings of the 11th Intern. Workshop, Yverdon-les-Bains, Switzerland, September 2001, pp. 7.3.1–7.3.10.

In order to provide a precharge voltage that is less than the positive supply voltage VDD, reference voltage sources that generate a constant voltage as the precharge voltage are generally used. Simple reference voltage sources can be constructed for example using voltage dividers with a corresponding number of resistors. However, reference voltage sources constructed in this way generally have the disadvantage of a relatively high power loss. A reference voltage for so-called high-end applications can also be generated by a bandgap reference. The bandgap reference can also be used to satisfy comparatively stringent stability requirements made of a precharge voltage, but a circuit of this type has a comparatively high area consumption.

SUMMARY OF THE INVENTION

It is accordingly an object of the invention to provide an integrated memory of the type mentioned in the introduction which overcomes the above-mentioned disadvantages of the prior art apparatus of this general type.

In particular, an object of the invention is to provide an integrated memory of the type mentioned in the introduction, which enables the power loss of the memory to be reduced in conjunction with comparatively low area consumption.

With the foregoing and other objects in view there is provided, in accordance with the invention, an integrated memory with a memory cell array including a plurality of memory cells, a plurality of word lines for selecting the plurality of the memory cells and a plurality of bit lines for reading out or writing data signals of the plurality of the memory cells. A precharge circuit is connected to at least one of the plurality of the bit lines. The precharge circuit is for precharging the one of the plurality of the bit lines to a precharge voltage generated from a supply voltage that is different from the precharge voltage. The precharge circuit has a loop regulating circuit for setting the precharge voltage using an actual voltage of the one of the plurality bit lines.

In accordance with an added feature of the invention, the precharge circuit has a regulator exhibiting hysteresis.

In accordance with an additional feature of the invention, the precharge circuit has a Schmitt trigger.

In accordance with another feature of the invention, there is provided, a terminal for obtaining a supply voltage. The precharge circuit includes a precharge transistor having a controlled path connected to the terminal for obtaining the supply voltage. The precharge transistor is turned on or off depending on an actual voltage of the one of the plurality of the bit lines.

In accordance with a further feature of the invention, the precharge transistor is of a p conductivity type or an n conductivity type.

In accordance with a further added feature of the invention, there is provided, a plurality of precharge circuits and a plurality of switches. The plurality of the bit lines are organized into a plurality of bit line pairs. Each one of the plurality of precharge circuits is provided for a respective one of the plurality of the bit line pairs. Each one of the plurality of the switches is for connecting together respective ones of the plurality of the bit lines associated with a respective one of the plurality of the bit line pairs. The precharge circuit of the integrated memory serves for precharging at least one of the bit lines to a precharge voltage. The precharge voltage is generated from a supply voltage of the memory, which differs from the precharge voltage. In particular, the magnitude of the precharge voltage is lower than that of the supply voltage of the memory, which, by way of example, is a positive supply voltage VDD of the memory. According to the invention, for setting the precharge voltage, the precharge circuit has a loop regulating circuit using an actual voltage of the corresponding bit line to be precharged. The precharge circuit can thus advantageously be realized by a local loop regulation requiring only a comparatively simple circuit which takes up only relatively little area. Integration into an existing memory design is possible with little outlay. Moreover, using a local loop regulation, it is possible for the power consumption or the power loss of the precharge circuit to be kept low since the precharging can be controlled in a targeted manner depending on the actual voltage of the bit line being precharged. For the case where the actual voltage reaches the predetermined value of the precharge voltage, the precharging of the relevant bit line can be interrupted or ended. In this case, the precharge circuit takes up essentially no power, as a result of which the power loss of the memory can be reduced overall.

In an advantageous embodiment of the inventive memory, the precharge circuit has a regulator exhibiting hysteresis. This advantageously makes it possible to avoid the situation in which driven actuators or control circuits of the loop regulating circuit are actuated correspondingly often on account of harmonics or superimposed interference. In a preferred embodiment of the invention, the precharge circuit has a switching amplifier with hysteresis in the form of a Schmitt trigger.

In an advantageous development of the invention, the precharge circuit has a precharge transistor, whose controlled path is connected to a terminal for the supply voltage of the memory. The precharge transistor is turned on or off depending on the actual voltage of the bit line to be precharged. This means that, in the on state of the precharge transistor, the bit line to be precharged is charged to the precharge voltage and the precharge operation is ended, upon reaching the predetermined value of the precharge voltage, by turning off the precharge transistor. An embodiment of this type can be integrated into an existing design of an integrated memory with little outlay.

Since the precharge transistor is connected to the supply voltage of the memory, the advantage is afforded over conventional reference voltage sources that the drain-source voltage or the collector-emitter voltage of the precharge transistor, at the time at which the precharge transistor is switched off, is greater than in the case of a comparable interconnection of a precharge transistor which connects a conventional reference voltage source and the bit line to be precharged to one another. A large current flows primarily toward the end of the precharge cycle, which entails a speed advantage. Both a transistor of the p conductivity type and a transistor of the n conductivity type can advantageously be used as precharge transistor.

Other features which are considered as characteristic for the invention are set forth in the appended claims.

Although the invention is illustrated and described herein as embodied in an integrated memory having a precharge circuit for precharging a bit line, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
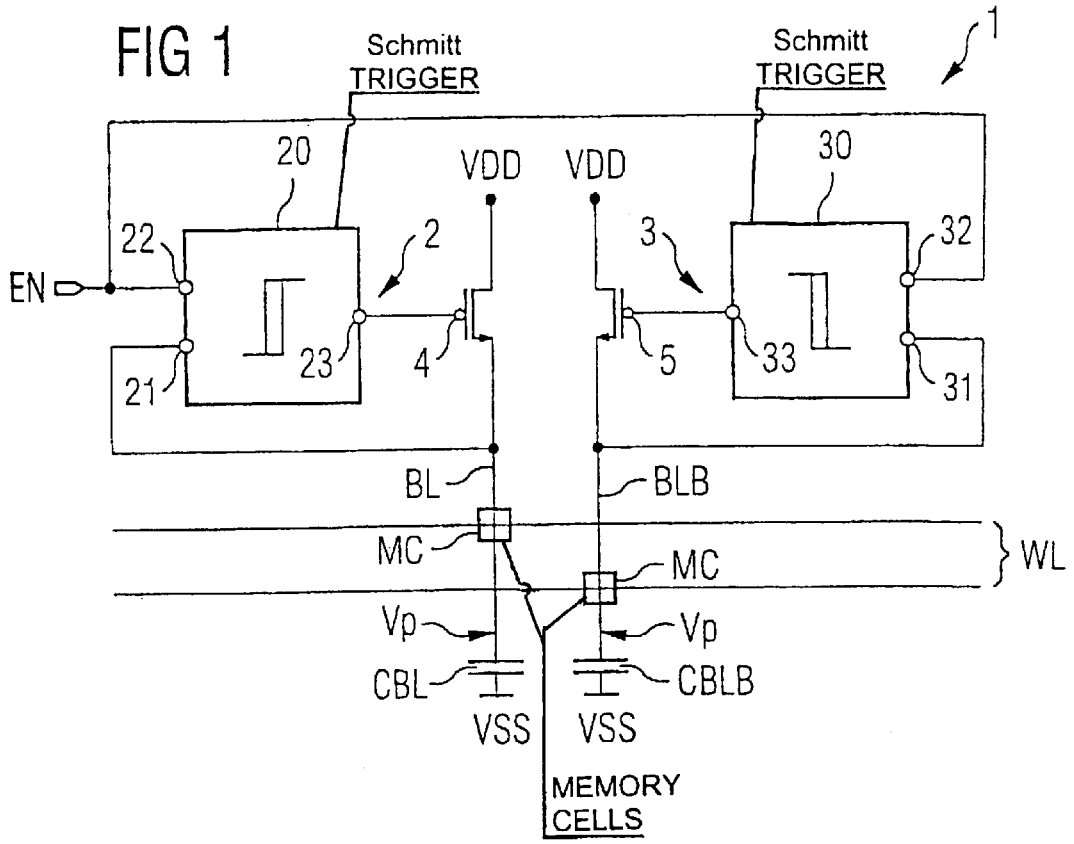
FIG. 1 is a diagram of an embodiment of an integrated memory having bit lines organized in bit line pairs, where each bit line of a bit line pair is precharged by a dedicated precharge circuit.

Referring now to the figures of the drawing in detail and first, particularly, to FIG. 1 thereof, there is diagrammatically shown a memory cell array of an inventive integrated memory having word lines WL and bit lines BL, BLB. For the sake of clarity, the illustration shows only one bit line including the bit line BL and the bit line BLB that is complementary thereto. In reality, a multiplicity of bit lines and word lines are provided in each case. The line capacitances of the respective bit line are symbolized by CBL and CBLB, respectively. The memory cells MC are arranged in a known manner at crossover points between the word lines and bit lines and are each connected to one of the word lines and one of the bit lines. Each memory cell contains a selection transistor and a cell capacitor, which are not shown for the sake of clarity. Corresponding selection transistors are selected by the word lines, and the transistors are then opened. If the respective selection transistor is open, then the information stored in the respective memory cell can be read out or an item of information to be stored can be written to the memory cell.

The memory 1 shown in FIG. 1 furthermore has precharge circuits 2 and 3, which are connected to the bit lines BL and BLB, respectively. The bit lines BL and BLB are precharged by the precharge circuits 2 and 3 to a precharge voltage Vp, which is less than the supply voltage VDD of the memory. The precharge circuits 2 and 3 respectively have a precharge transistor 4, 5, whose controlled paths are in each case connected to a terminal for the supply voltage VDD and the reference-ground voltage VSS of the memory. The precharge circuits 2 and 3 furthermore contain a Schmitt trigger 20 and 30, respectively. Inputs 21 and 31 of the Schmitt triggers 20, 30 are connected to the bit line BL and the bit line BLB, respectively. Outputs 23 and 33 of the Schmitt triggers are connected to respective control terminals of the precharge transistors 4, 5.

If the predetermined value for the precharge voltage of the bit line BL, BLB to be precharged is undershot, then the relevant precharge transistor 4, 5 is activated via the respective Schmitt trigger 20, 30. Once a predetermined voltage value of the actual voltage has been reached, the relevant precharge transistor is switched off again. A self-regulating precharge circuit with a loop regulating circuit is provided in this way. The respective local loop regulation requires only a comparatively small area. In the case where the precharge transistor is switched off, the relevant precharge circuit takes up essentially no power, so that the power loss of the memory decreases overall as a result. The time for which the precharge transistor is switched off is generally an order of magnitude longer than the time for which the precharge transistor is switched on, since the relevant bit line (for example by means of parasitic currents) is generally discharged only with a comparatively large time constant. As a result, no power is taken up by the precharge circuit in a comparatively long operating time period of the memory.

The relevant Schmitt trigger can be activated and deactivated by the action signal EN at the respective input 22 and 32 of the Schmitt triggers 20, 30, for example, during the reading and writing of data signals of memory cells. For the case where the relevant Schmitt trigger is to be individually activated or deactivated, a logic unit connected upstream or downstream of the relevant Schmitt trigger may be provided, which generates the corresponding activation signal EN.

Figure 2:
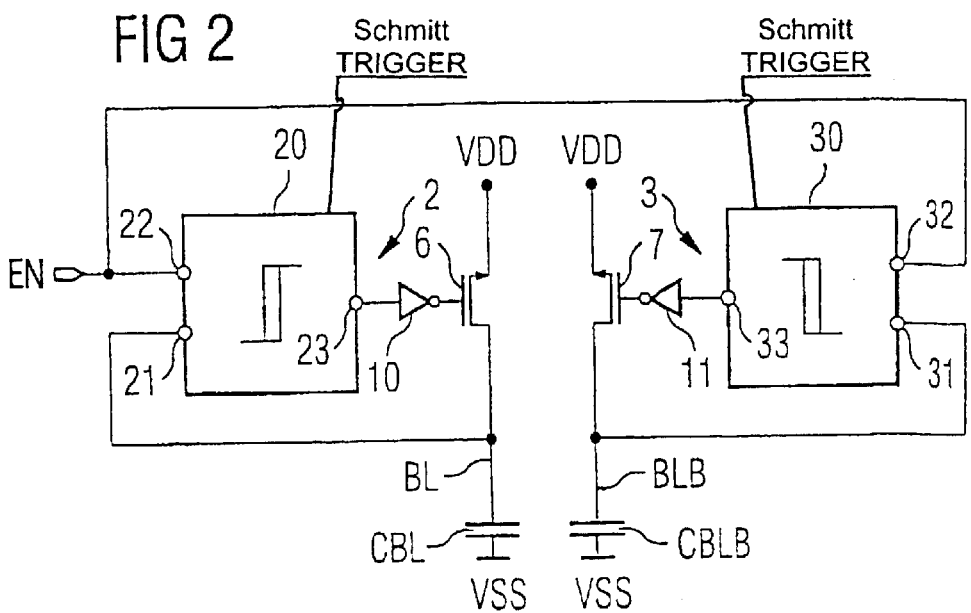
FIG. 2 is a diagram of another embodiment of an integrated memory having bit lines organized in bit line pairs, where each bit line of a bit line pair is precharged by a dedicated precharge circuit.

FIG. 2 illustrates a further embodiment of an integrated memory having a circuit construction that is essentially identical to that of the embodiment shown in FIG. 1. Since the precharge voltage Vp is less than the supply voltage VDD of the memory, an n-channel transistor 6 as shown in FIG. 2 can also be used instead of the p-channel transistor 4 shown in FIG. 1. Accordingly, a respective inverter 10, 11 is connected between the output 23, 33 of the Schmitt trigger 20, 30 and the control terminal of the precharge transistor 6, 7.

Figure 3:
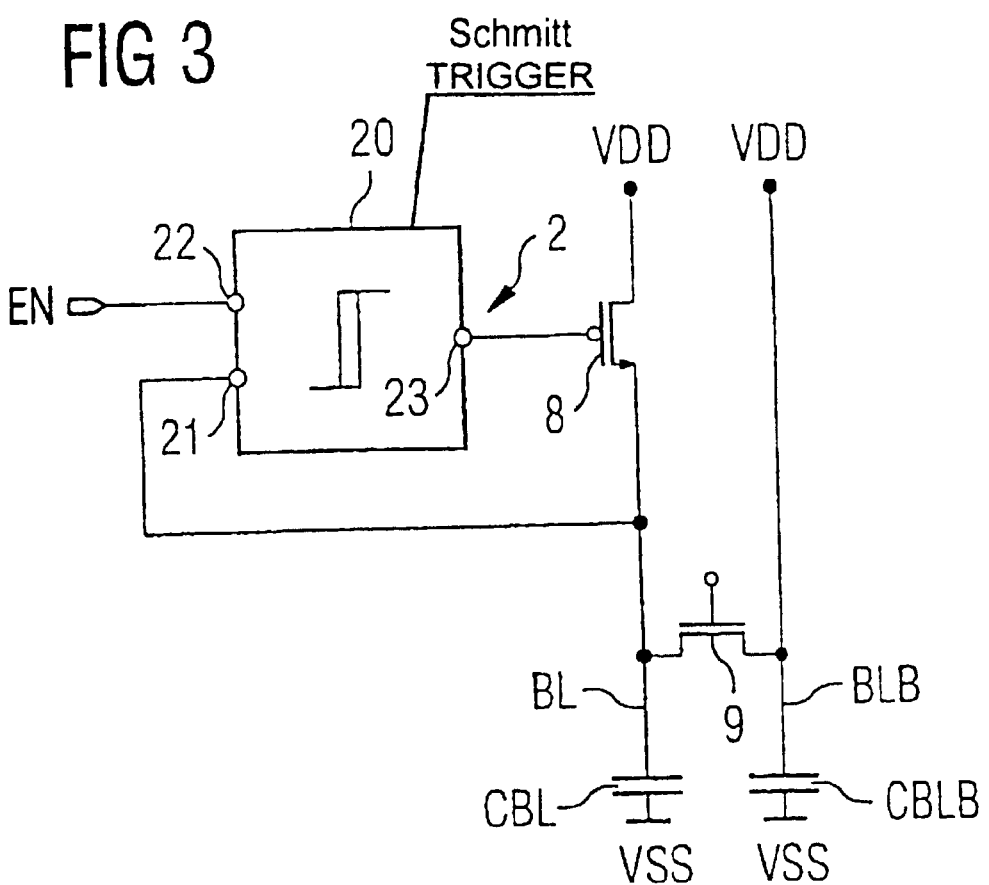
FIG. 3 is a diagram of an embodiment of an integrated memory in which only one precharge circuit is provided per bit line pair.

FIG. 3 shows an embodiment of a memory in which only one Schmitt trigger 20 is provided per bit line pair with the bit lines BL, BLB. The bit lines BL, BLB can be connected to one another via a switch 9. Consequently, via the precharge transistor 8 and the switch 9, the bit lines BL and BLB can be precharged by using only one precharge circuit 2.

I claim:

1. An integrated memory, comprising:
   a memory cell array including a plurality of memory cells, a plurality of word lines for selecting said plurality of said memory cells and a plurality of bit lines for reading out or writing data signals of said plurality of said memory cells; and
   a precharge circuit connected to at least one of said plurality of said bit lines, said precharge circuit for precharging said one of said plurality of said bit lines to a precharge voltage generated from a supply voltage being different from said precharge voltage;
   said precharge circuit having a loop regulating circuit for setting said precharge voltage using an actual voltage of said one of said plurality bit lines.

2. The integrated memory according to claim 1, wherein said precharge circuit has a regulator exhibiting hysteresis.

3. The integrated memory according to claim 2, wherein said precharge circuit has a Schmitt trigger.

4. The integrated memory according to claim 1, comprising:
   a terminal for obtaining a supply voltage;
   said precharge circuit including a precharge transistor having a controlled path connected to said terminal for obtaining the supply voltage;
   said precharge transistor being turned on or off depending on an actual voltage of said one of said plurality of said bit lines.

5. The integrated memory according to claim 4, wherein said precharge transistor is of a conductivity type selected from a group consisting of a p conductivity type and an n conductivity type.

6. The integrated memory according to claim 1, comprising:
   a plurality of precharge circuits; and
   a plurality of switches;
   said plurality of said bit lines being organized into a plurality of bit line pairs;
   each one of said plurality of precharge circuits provided for a respective one of said plurality of said bit line pairs; and
   each one of said plurality of said switches for connecting together respective ones of said plurality of said bit lines associated with a respective one of said plurality of said bit line pairs.

* * * * *